(12) United States Patent
Kourti et al.

(10) Patent No.: US 10,263,320 B2
(45) Date of Patent: Apr. 16, 2019

(54) METHODS OF MAKING STRETCHABLE AND FLEXIBLE ELECTRONICS

(71) Applicant: Ohio State Innovation Foundation, Columbus, OH (US)

(72) Inventors: Asimina Kourti, Columbus, OH (US); John L. Volakis, Columbus, OH (US); Robert Lee, Hilliard, OH (US)

(*) Notice: Subject to any disclaimer, the term of this patent is extended or adjusted under 35 U.S.C. 154(b) by 130 days.

(21) Appl. No.: 15/211,005

(22) Filed: Jul. 15, 2016

(65) Prior Publication Data

US 2017/0018843 A1  Jan. 19, 2017

Related U.S. Application Data

(60) Provisional application No. 62/193,658, filed on Jul. 17, 2015, provisional application No. 62/194,469, filed on Jul. 20, 2015.

(51) Int. Cl.
*H01Q 1/27* (2006.01)
*H01Q 21/00* (2006.01)
(Continued)

(52) U.S. Cl.
CPC ............. *H01Q 1/273* (2013.01); *H01P 11/00* (2013.01); *H01Q 1/36* (2013.01); *H01Q 9/26* (2013.01); *H01Q 21/0087* (2013.01); *H04B 1/385* (2013.01); *H04B 1/3827* (2013.01); *B29C 45/14344* (2013.01); *B32B 5/24* (2013.01); *B32B 5/26* (2013.01); *C08F 255/00* (2013.01); *H01L 51/0012* (2013.01); *Y10T 29/49005* (2015.01); *Y10T 29/4908* (2015.01); *Y10T 29/49016* (2015.01); *Y10T 29/49155* (2015.01)

(58) Field of Classification Search
CPC ........ H01Q 1/273; H01Q 1/36; H01Q 1/3827; H01Q 1/385; H01Q 9/26; H01Q 21/0087; Y10T 29/49005; Y10T 29/49016; Y10T 29/4908; Y10T 29/49155; B32B 5/24; B32B 5/26; C08F 255/00; B29C 45/14344; H01L 51/0012; H01P 11/00
See application file for complete search history.

(56) References Cited

U.S. PATENT DOCUMENTS 6,243,472 B1 * 6/2001 Bilan ................. Y10T 29/49005
29/594
6,332,262 B1 * 12/2001 Sakamoto ............ Y10T 29/4908
29/594
(Continued)

FOREIGN PATENT DOCUMENTS

JP    2013035580 A  *  2/2013

*Primary Examiner* — A. Dexter Tugbang
(74) *Attorney, Agent, or Firm* — Benesch, Friendlander, Coplan & Aronoff LLP

(57) ABSTRACT

A method of making a stretchable and flexible electronic device includes the steps of creating a computer aided design using a computer modeling software system of the electronic device; digitizing the computer aided design and importing the design into a computer memory of a sewing machine capable of performing embroidery; using the sewing machine and a conductive thread to embroider the design on to a fabric substrate to create the electronic device, whereby the electronic device comprises at least a portion of conductive threads; removing the fabric substrate from the electronic device using heat; coating the electronic device with a polymer.

16 Claims, 16 Drawing Sheets

(51) Int. Cl.

| | |
|---|---|
| *H01P 11/00* | (2006.01) |
| *H04B 1/3827* | (2015.01) |
| *H01Q 1/36* | (2006.01) |
| *H01Q 9/26* | (2006.01) |
| *B29C 45/14* | (2006.01) |
| *B32B 5/26* | (2006.01) |
| *C08F 255/00* | (2006.01) |
| *H01L 51/00* | (2006.01) |
| *B32B 5/24* | (2006.01) |

(56) References Cited

U.S. PATENT DOCUMENTS

| | | | |
|---|---|---|---|
| 8,756,805 B2* | 6/2014 | Yamaguchi | Y10T 29/49155 29/825 |
| 2002/0021549 A1* | 2/2002 | Kono | B29C 45/14344 361/679.01 |
| 2008/0221270 A1* | 9/2008 | Kano | C08F 255/00 525/63 |
| 2010/0147562 A1* | 6/2010 | Chu | B32B 5/26 174/254 |
| 2014/0014932 A1* | 1/2014 | Murakami | H01L 51/0012 257/40 |

* cited by examiner

METHODS OF MAKING STRETCHABLE AND FLEXIBLE ELECTRONICS

CROSS-REFERENCE TO RELATED APPLICATIONS

This application claims priority from U.S. Provisional Patent Application No. 62/193,658, filed on Jul. 17, 2015 and U.S. Provisional Patent Application No. 62/194,469, filed on Jul. 20, 2015, both of which are incorporated by reference herein in their entirety.

FIELD OF INVENTION

This disclosure relates to an electronic device that is stretchable and flexible and methods of making and using the same. Specifically, stretchable and flexible electronic devices, such as an antenna or circuit, may be made from conductive thread (E-fiber) materials and incorporated into clothing or other products to, for example, be used to boost a Wi-Fi or cell phone signal from a neighboring router or cell phone tower.

BACKGROUND

Antennas, for example, are traditionally made of copper or by etching metal patterns on rigid substrates. When stretched, folded, or twisted, these antennas become permanently deformed, or even break. For applications that require flexibility and are subject to continuous deformation, such as for use in clothing, it would be useful to create an antenna, or other electronic device, that is capable of stretching and moving with the wearer or user, without breaking or causing permanent deformation.

SUMMARY

In one embodiment, a method of making a stretchable and flexible electronic device includes the steps of creating a computer aided design using a computer modeling software system of the electronic device; digitizing the computer aided design and importing the design into a computer memory of a sewing machine capable of performing embroidery; using the sewing machine and a conductive thread to embroider the design on to a fabric substrate to create the electronic device, whereby the electronic device comprises at least a portion of the conductive thread; removing the fabric substrate from the electronic device using heat; integrating the electronic device within a layer of polymer.

In another embodiment, a method of using a wearable antenna includes using the wearable antenna to collect radio frequency signals from a wireless router or a cell phone tower, wherein the wearable antenna is fabricated using conductive thread; transmitting the collected signal from the wearable antenna to associated circuitry to create an enhanced radio frequency signal; transmitting the enhanced radio frequency signal from the associated circuitry to the wearable antenna; and wirelessly transmitting the enhanced radio frequency signal from the wearable antenna to a mobile device.

BRIEF DESCRIPTION OF THE DRAWINGS

The accompanying figures, which are incorporated in and constitute a part of the specification, illustrate various example systems, apparatuses, and methods, and are used merely to illustrate various example embodiments. In the figures, like elements bear like reference numerals.

DETAILED DESCRIPTION

A flexible and stretchable electronic device may be made by using embroidery or sewing techniques to create the electronic device from conductive threads (E-fibers) and then integrating that device within a layer of polymer. For the purpose of this description, the electronic device will be referred to as an "antenna," but it should be understood that other electronic devices may also be implemented using the same process, such as circuits. The antennas may be used for many different applications, such as in RFIDs, medical sensors, wearable electronics, and in tire tread.

Figure 1:
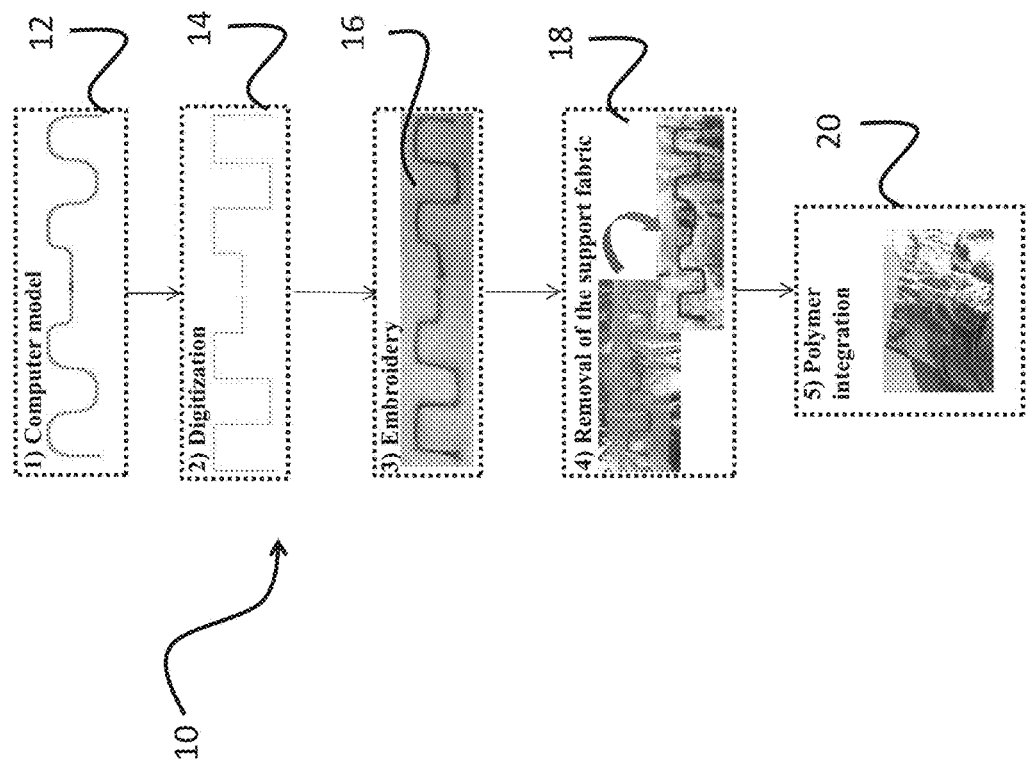
FIG. 1 is a flow chart detailing a schematic representation of one embodiment of a method for making a flexible and stretchable electronic device.

In one embodiment, as shown in FIG. 1, a method for making a flexible and stretchable wire antenna 10 may include creating a computer model 12 of the desired antenna design. The computer model may be created using any desirable computational or analysis methodology to create a computer-aided design file (CAD). Ideally, the design will include antennas with angles that can adequately be performed by the chosen embroidery process. For example, when thick (diameter greater than or equal to about 0.53 mm) E-fibers with high tensile strength are used in existing embroidery machines capable of performing the stitching required, sharp corners with ninety degree angles can be embroidered with bends of radius equal to about 5 mm. However, it should be appreciated that as technology advances, embroidery process may improve to allow for improved precision.

The CAD file created by the computer modeling step 12 will then be digitized 14 by importing the file into the software toolset of sewing machine, such as a Brother sewing machine, and converted into a digitized stitching pattern. The process may require consolidation of the design and fabrication geometry differences. Specifically, the difference between the digitized pattern and the stitched pattern can be controlled to achieve the desired stitched pattern on the fabric. For example, when thick E-fibers are used to embroider bends, then these bends should be modeled as sharp corners in the embroidery digitized file. These sharp corners can yield a stitched pattern on the fabric having bends. In one embodiment, the stitching density was set to about 1.3 stitches/mm.

An automatic embroidery process was then used to embroider the design of the antenna created by the computer model 12 on to a fabric substrate 16. In one embodiment, a conductive thread, or E-fiber, was used to create the embroidered pattern. The E-fiber may include one or more electrically-conductive filaments. Each filament may include a core and a conductive lining layer. In one embodiment, the conductive lining layer may be selected from silver, copper, nickel, or a combination thereof. The core may be conductive as well, or it may be a non-conductive polymer, such as Zylon® or Vectran®.

In one embodiment, the E-fiber may be created by twisting 664 Amberstrand® filaments, resulting in a composite thread of about 0.5 mm in diameter. It was found that this resulted in a thread with high flexibility, a breaking strength of about 46.2 lbs, and a low direct current (DC) resistance of about 0.5 to about 0.8Ω/ft. It should be understood that other threads may be used, depending on the desired resulting E-fiber characteristics, however, it has been discovered that the use of a small number of filaments to make thinner threads allows the antenna 22 to be embroidered onto the substrate while maintaining fine details of the CAD file (e.g. sharp corners). When using such thinner threads, the embroidery density will be increased in order to increase the surface conductivity of the antenna. It is also contemplated that a manual embroidery process may be employed, alleviating the need for the computer modeling 12 and digitization 14 processes. The manual process may be employed by either a sewing machine or with a hand-held needle.

Figure 2:
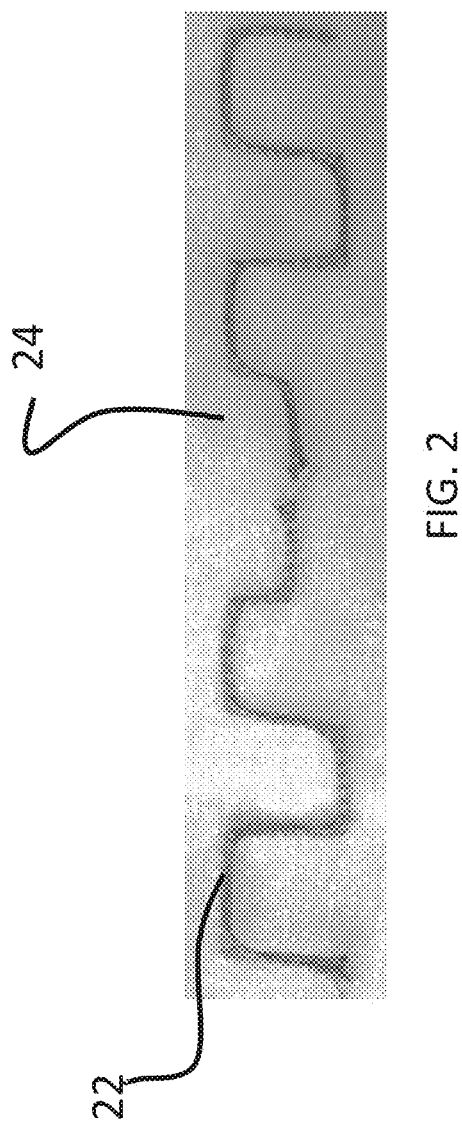
FIG. 2 is a top plan view of one embodiment of an antenna embroidered on to a fabric substrate.

In one embodiment, the E-fiber antenna 22 is embroidered onto a fabric substrate 24, as shown in FIG. 2. The substrate 24 may be any type of suitable fabric, such as polyester, silk, nylon, cotton, or other suitable materials. In this embodiment, geometrical precision of about 0.1 mm to about 0.5 mm was achieved. It should be understood by those of skill in the art the geometrical precision—the difference between the shape of the CAD file and the resulting embroidered antenna—is very important. The geometrical precision required for printed circuit boards is about 0.1 mm. It should be understood that the higher the precision of the embroidery process, the closer the antenna's performance will be to the traditionally made antenna, such as a copper antenna of the same shape. The antenna may be designed as either a multi-band or a broadband antenna, in order to cover the intended frequency band of operation, from about 700 MHz to about 5.9 GHz.

Figure 3:
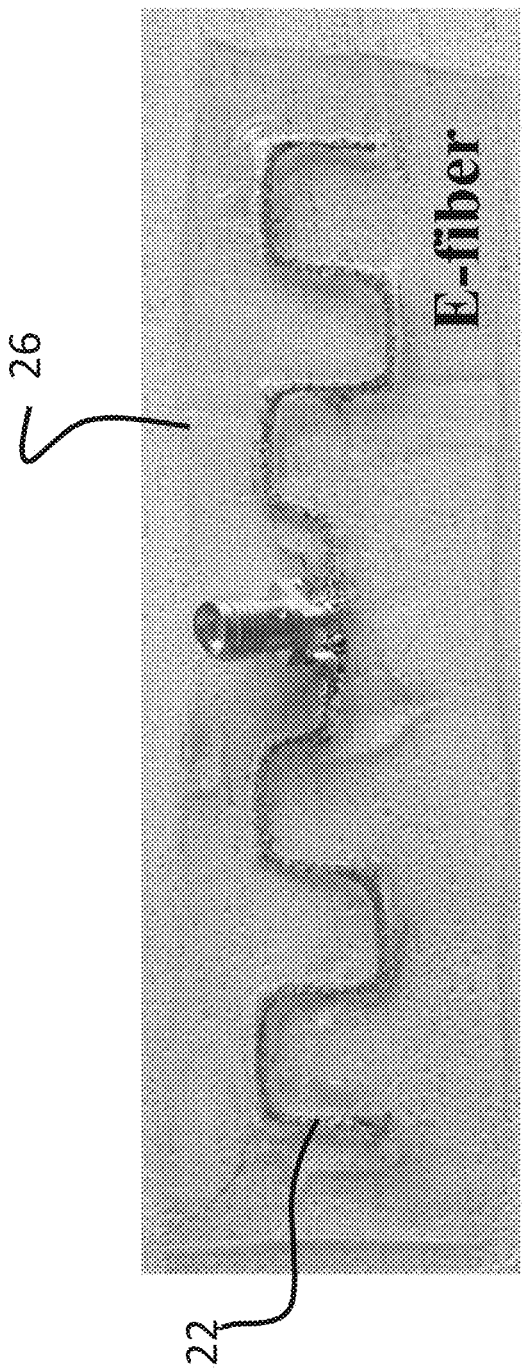
FIG. 3 is a top plan view of one embodiment of a stretchable and flexible antenna disposed within a polymer layer.

Referring again to FIG. 1, the substrate 24 is used to support the shape of the antenna 22. In order to achieve the desired flexibility and stretchability of the antenna 22, it was discovered that the substrate 24 must be removed 18 and the resulting antenna 22 embedded 20 in a stretchable polymer 26, as shown in FIG. 3. In one embodiment, the polymer 26 may be a silicon-based polymer, such as polydimethylsiloxane (PDMS) ($\varepsilon_r$=3, tan $\delta$<0.001) or a polyurethane polymer.

PDMS polymer allows for an antenna stretchability (elongation) of about 10% of its original size. It should be understood that other suitable polymers, such as Kraton, may be used, depending on the stretchability and flexibility required for the resulting coated antenna. In another embodiment, the polymer may further include a ceramic material, such as rare earth titanate (RET), dispersed throughout.

Figure 4:
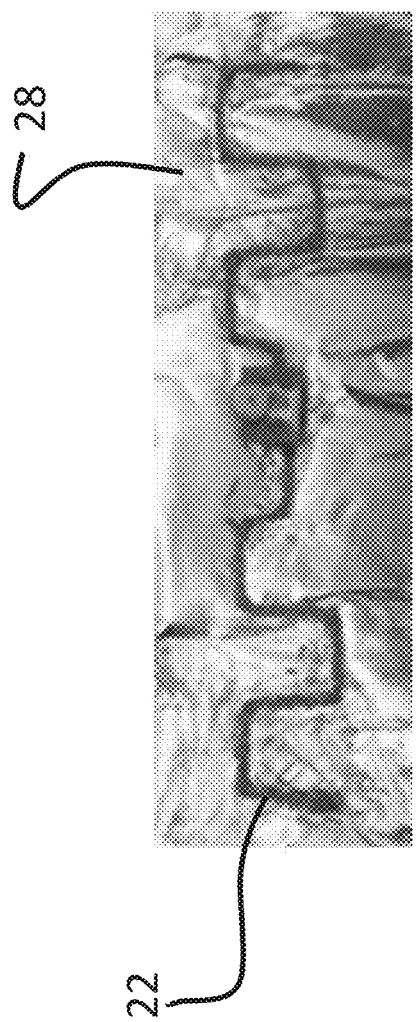
FIG. 4 is a top plan view of one embodiment of a textile antenna disposed on an adhesive side of a copper tape.

In order to remove the substrate 24 and preserve the original shape of the antenna 22, the antenna is placed on an adhesive surface of a copper tape 28, as shown in FIG. 4. It should be understood that other adhesive surfaces, such as green tape, may be used to preserve the original shape of the antenna. The substrate 24 is then removed using a soldering iron. In one embodiment, the fine tip of a soldering iron was used to perform localized heating of the substrate 24 having a melting point of about 250° C., but not melt the antenna 22 having a melting point of about 600° C. It should be understood that other processes, such as oven heating, may be used to heat the substrate 24.

Figure 5:
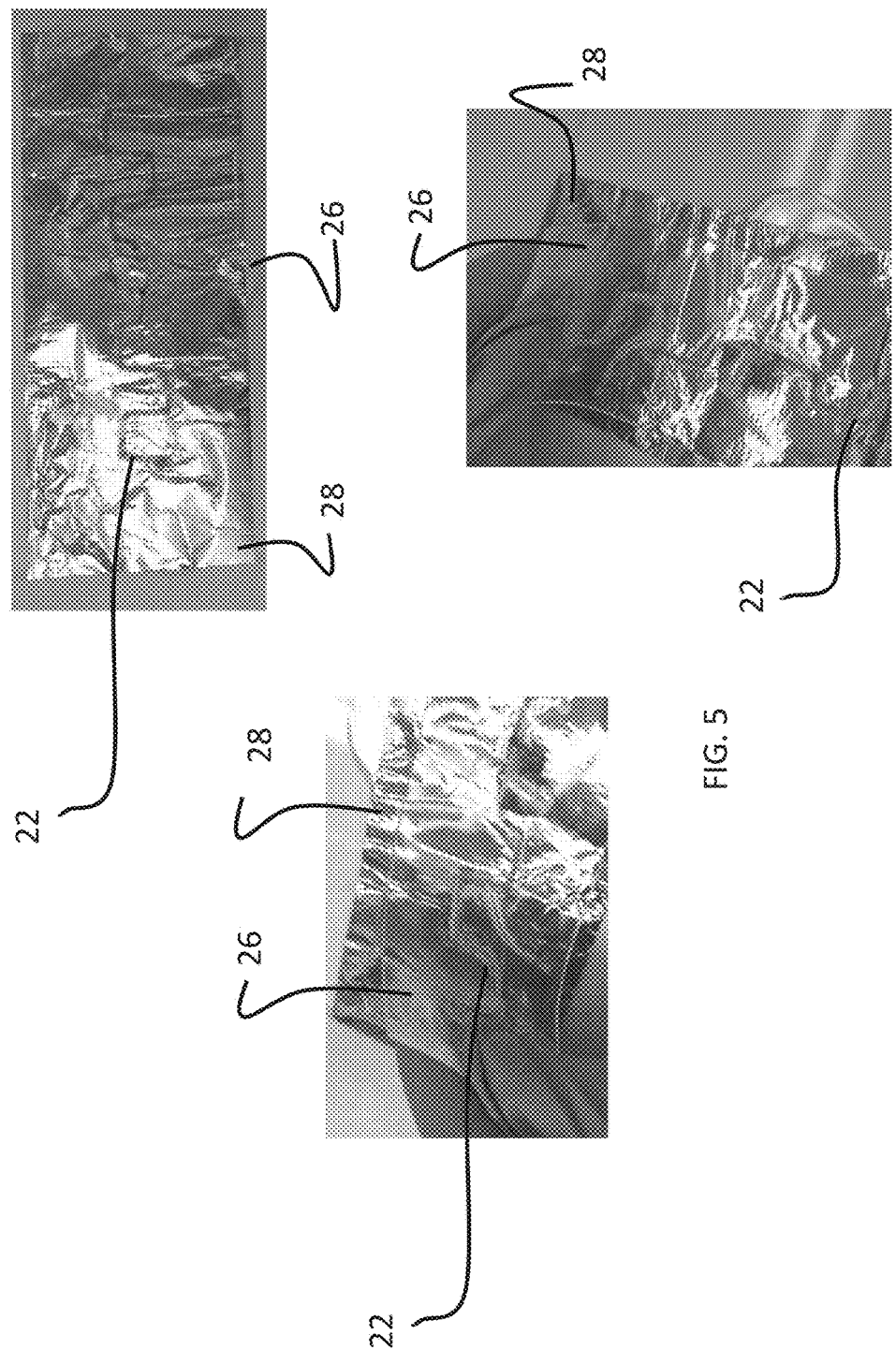
FIG. 5 is a perspective view of one embodiment of a stretchable and flexible antenna disposed within a polymer layer, while being readily removed from the adhesive side of a copper tape.
Figure 6:
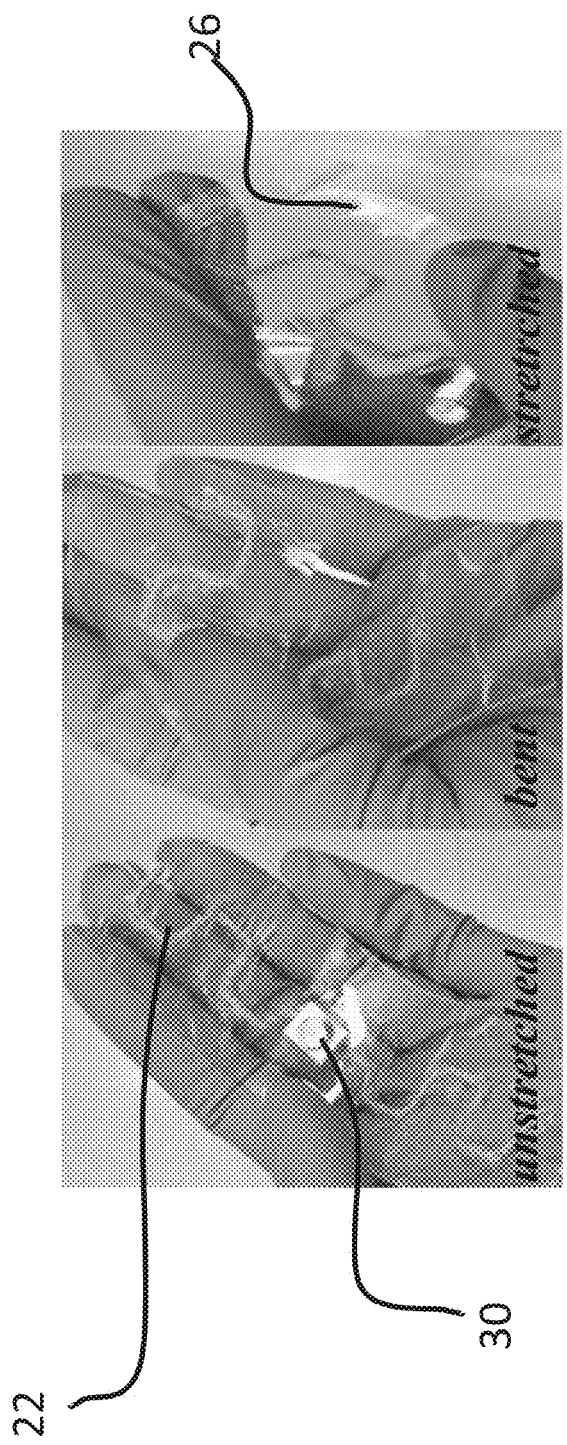
FIG. 6 is a perspective view of one embodiment of a stretchable and flexible antenna disposed within a polymer layer in a flat, bent, and stretched configuration.

Once the substrate 24 has been removed, the antenna 22 may be coated or integrated 20 within a polymer layer 26, as shown in FIG. 3. For example, in order to create a PDMS polymer layer 26, the base and curing agent of the PDMS are mixed at room temperature in a vacuum mixer (not shown). A bubble-free PDMS mixture is then poured on to the antenna 22, while the antenna 22 is still lightly adhered to the copper tape 28, as shown in FIG. 5. A thin layer of liquid polymer, about 1 mm to about 2 mm, is formed around the antenna 22 and a curing process under elevated temperatures, about 120° C., is conducted. Once cured, the underlying copper tape 28 is removed to result in an antenna 22 that will hold its shape while being bent and stretched, as shown in FIG. 6. It has been found that the textile antenna 22 may be stretched along with the surrounding polymer layer 26.

As shown in FIG. 6, the antenna 22 coated in polymer 26 may also include a suitable connector 30. It should be understood that the connector 30 may be attached to the antenna 22 before it is coated in the polymer 26 and that the polymer 26 will then form around the connector during the integration process 20. In one embodiment, the antenna 22 may be used to collect and transmit signals with frequencies up to about 4 GHz.

EXAMPLE 1

Figure 7:
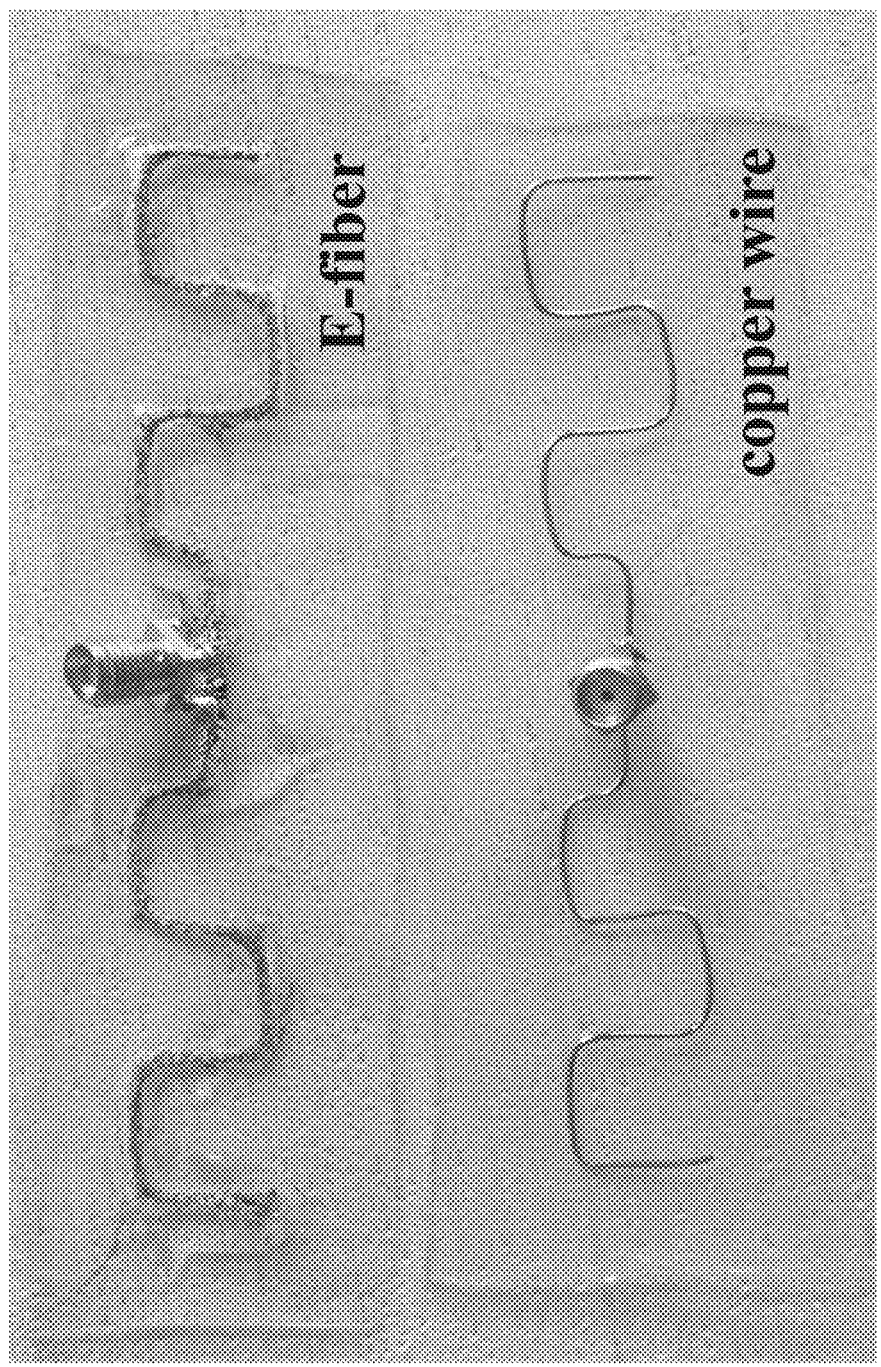
FIG. 7 is a top plan view of one embodiment of a stretchable and flexible antenna and a copper antenna disposed within a polymer layer.

In one embodiment, an antenna was made according to the method disclosed above and was constructed to operate at 915 MHz. In order to verify that the antenna was operating at 915 MHz, the antenna's reflection coefficient as a function of frequency was measured using a Vector Network Analyzer (VNA). The antenna has a meandered wire geometry, as shown in FIG. 7 and has a length of about 95.66 and a width of about 12.6 mm. In order to assess the performance of the E-fiber wire antenna, a copper wire antenna with the same geometry was also embedded in a PDMS polymer layer.

The measured reflection coefficient and impedance data of the E-fiber antenna and the copper wire antenna were measured. The results of those measurements are shown in Table I below and in FIG. 8.

TABLE I

|  | Conductor | Refl. Coeff. At 915 MHz | 10 dB Bandwidth | Avg. Realized Gain |
|---|---|---|---|---|
| Antenna 1 | 664-Filament Amberstrand | −25.4 dB | 90 MHz | 1.79 dBi |
| Copper Antenna | Copper | −14.5 dB | 69 MHz | 1.85 dBi |

It was determined from those measurements that differences between the two antennas were within the acceptable limits, although Antenna 1 exhibits slightly lower gain. Without being bound by this theory, it is hypothesized that this is due to losses in the silver-coated polymer E-fibers as well as surface roughness inherent to E-fiber surfaces. Nevertheless, the gain discrepancy of 0.06 dB shown in Table I is insignificant. Results have shown that E-fiber surfaces perform almost equally well as their copper counterparts for frequencies up to around 3 GHz. Beyond 3 GHz, gain discrepancies higher than 1 dB are observed. It should be noted that the reflection coefficient and gain/pattern data obtained after two months of repetitive stretching and flexing indicated no change in antenna performance.

Figure 8:
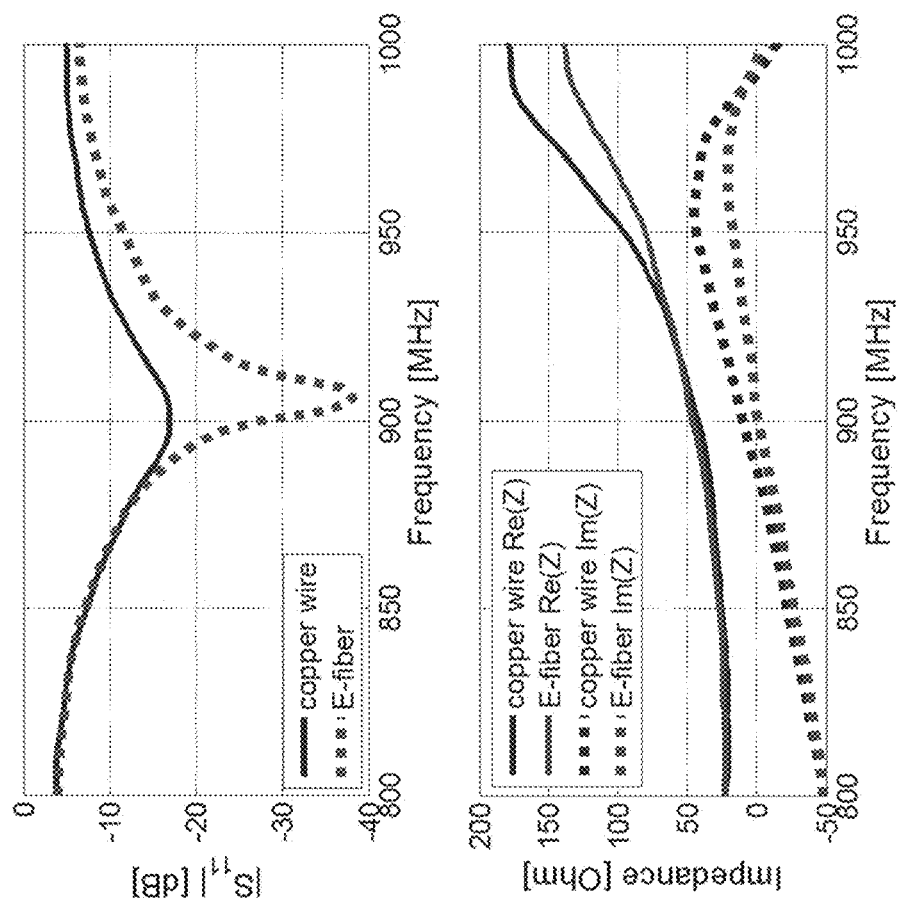
FIG. 8 is a graphical comparison of the measured reflection coefficient and impedance data of one embodiment of an E-fiber antenna and a copper wire antenna.
Figure 9:
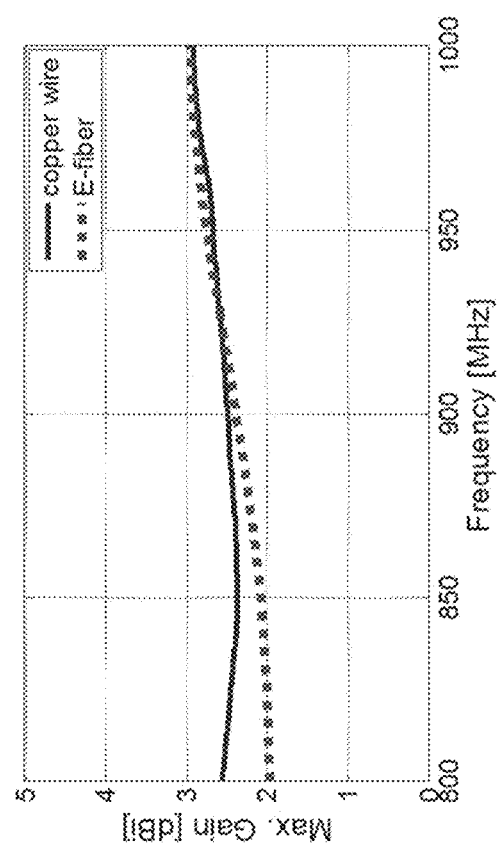
FIG. 9 is a graphical comparison of the measured max gain of one embodiment of an E-fiber antenna and a copper wire antenna.
Figure 10:
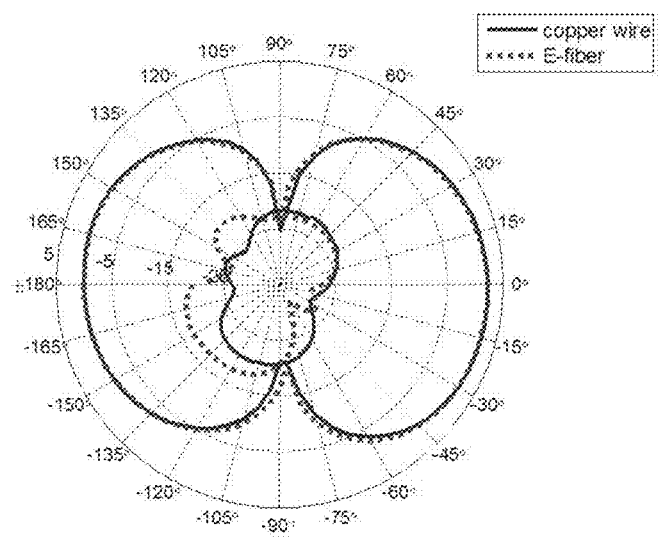
FIG. 10 is a graphical comparison of the measured co-polarization and cross-polarization radiation patterns of one embodiment of a stretchable and flexible E-fiber antenna and a copper wire antenna at 915 MHz (E-plane and H-plane).
Figure 10:
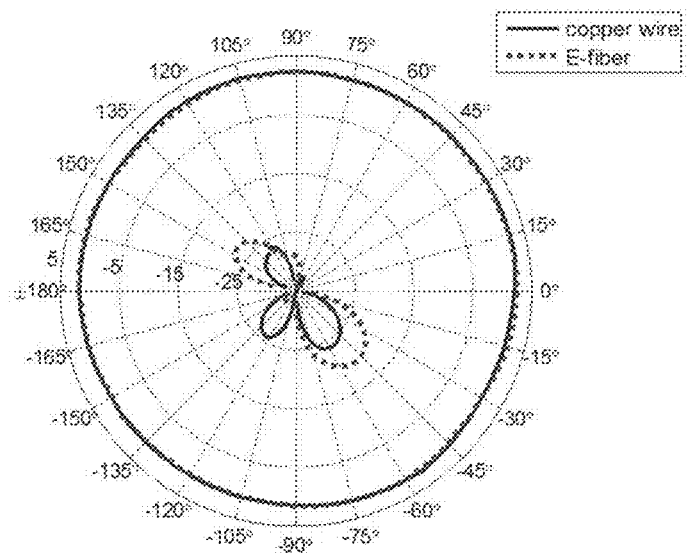

The corresponding measured realized gain (max) is shown in FIG. 9 from 800 MHz to 1000 MHz. At 915 MHz, the maximum realized gain was 2.49 and 2.54 dBi for the E-fiber antenna and copper antenna, respectively. It was determined that compared to the copper wire antenna, the E-fiber antenna exhibited a slightly lower gain, which likely correlates to the superior bandwidth matching performance of the E-fiber antenna, as shown in FIG. 8. Also, as shown in FIG. 10, the measured co-polarization and cross-polarization radiation patters of the antennas at 915 MHz (E-plan and H-plane) were measured. The co-polarization patterns were found to exhibit very good agreement, with a discrepancy of less than 0.6 dB.

EXAMPLE 2

Figure 11:
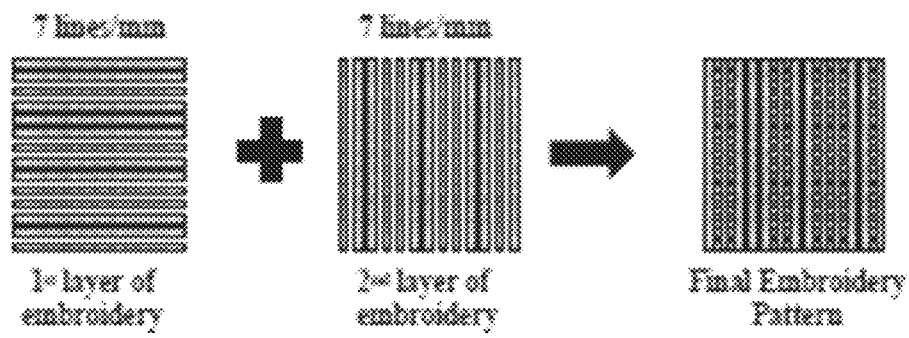
FIG. 11 is a schematic illustration of one method of creating an embroidery pattern for an embodiment of the stretchable and flexible antenna.
Figure 12:
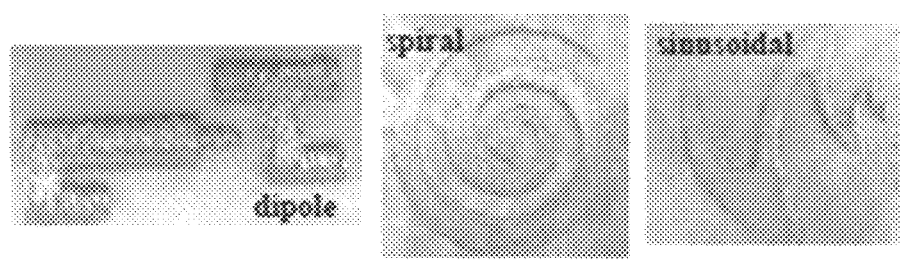
FIG. 12 is a top plan view of E-fiber antennas stitched in dipole, spiral, and sinusoidal patterns.

E-fiber antennas were created using the general process described above. In this embodiment, the E-fibers used for embroidery were 40-filament Liberator™ and 20-filament Liberator™, with diameters of 0.27 mm and 0.22 mm and DC resistances of 1Ω/ft and 2Ω/ft, respectively. Dual layer embroidery at 7 threads/mm, as shown in FIG. 11, was used to create antennas with dipole, spiral, and sinusoidal shapes, as shown in FIG. 12. This dense embroidery reduces physical discontinuities and achieves surface conductivity close to that of copper. It was found that the antennas made with the 40-filament Liberator E-fibers exhibit higher conductivity. However, due to their finer thickness, the Liberator-20 E-fibers were superior in embroidering sharp corners. Therefore, it was determined that it may be necessary to use different E-fibers for different parts of the antenna patterns.

EXAMPLE 3

Three dipole antennas operating at 2.45 GHz were fabricated and measured, as described in the description above and below in Table II. The shape of the antennas is described in FIG. 12, above. The antennas were 38 mm×16 mm with sharp corners, slots and a required accuracy of 0.3 mm. The E-fiber antennas were found to have good agreement with the copper antenna, with Antenna 1 radiating equally well with Antenna 3 and Antenna 2 exhibiting about 0.6 dB lower gain, on average. This was attributed to the slightly lower conductivity of the Liberator-20, as discussed above.

TABLE II

|  | Conductor | Refl. Coeff. At 2.45 GHz | 5 dB Bandwidth | Avg. Realized Gain at 2.45 GHz |
|---|---|---|---|---|
| Antenna 1 | 40-Filament Liberator | −9.9 dB | 1020 MHz | 1.28 dBi |
| Antenna 2 | 20-Filament Liberator | −9.9 dB | 900 MHz | 0.6 dBi |
| Antenna 3 | Copper | −9.9 dB | 1065 MHz | 1.31 dBi |

EXAMPLE 4

In yet another embodiment, 7 silver-plated copper Elektrisola filaments were twisted together to form a conductive thread with a 0.12 mm diameter. The thread exhibited a very low DC resistance of about 0.58Ω/ft. It was found that the 7-filament Elektrisola threads were two times thinner, had 3.5 times lower DC resistance, and cost 12 times less than the 20-filament Liberator threads. It was also found that the thinner threads exhibited lower embroidery tension and high flexibility, leading to a geometrical precision of 0.1 mm. And, with the lower DC resistance, it was determined that only a single layer, as opposed to the double layer, of embroidery was needed to achieve the highly conductive textile surfaces required. It was found that embroidery density was optimized with this single layer stitching at 7 threads/mm.

Figure 13:
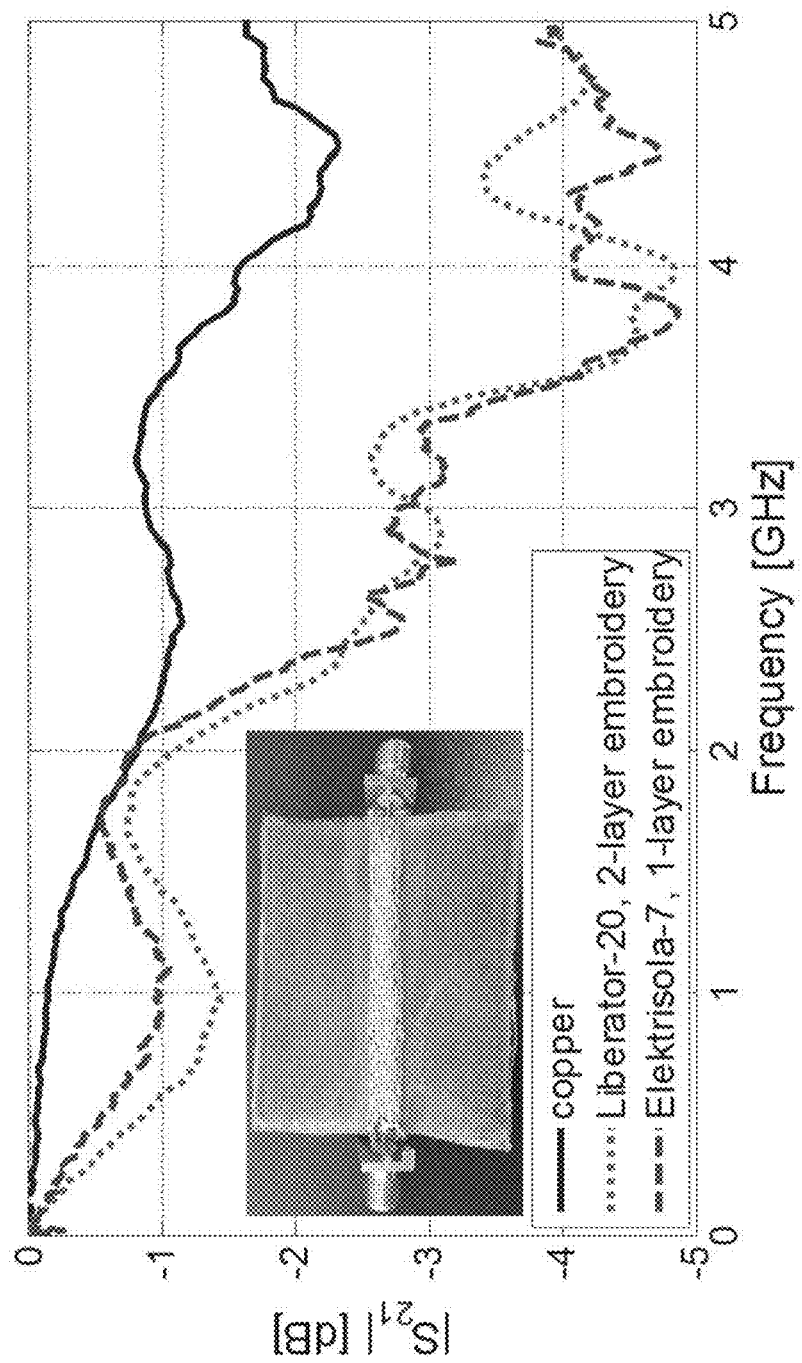
FIG. 13 is a top view of a 50Ω transmission line embroidered using 7-filament Elektrisola E-fibers, embedded within a graphical comparison of the RF performance of three embodiments of transmission lines.

A 50Ω transmission line was created using a single layer embroidery pattern with 7-filament Elektrisola thread and integrated within a 1.5 mm layer of PDMS polymer ($\varepsilon_r$=3, tan δ<0.001) layer, as shown in FIG. 13. It was then compared to similar transmission lines made of copper and 20-filament Liberator threads with a two-layer embroidery pattern. It was found that the RF performance was very similar to that achieved by the 20-filament Liberator thread, using 50% less E-fiber thread, reducing the cost by about 24 times, and increasing the accuracy three fold.

EXAMPLE 5

Figure 14:
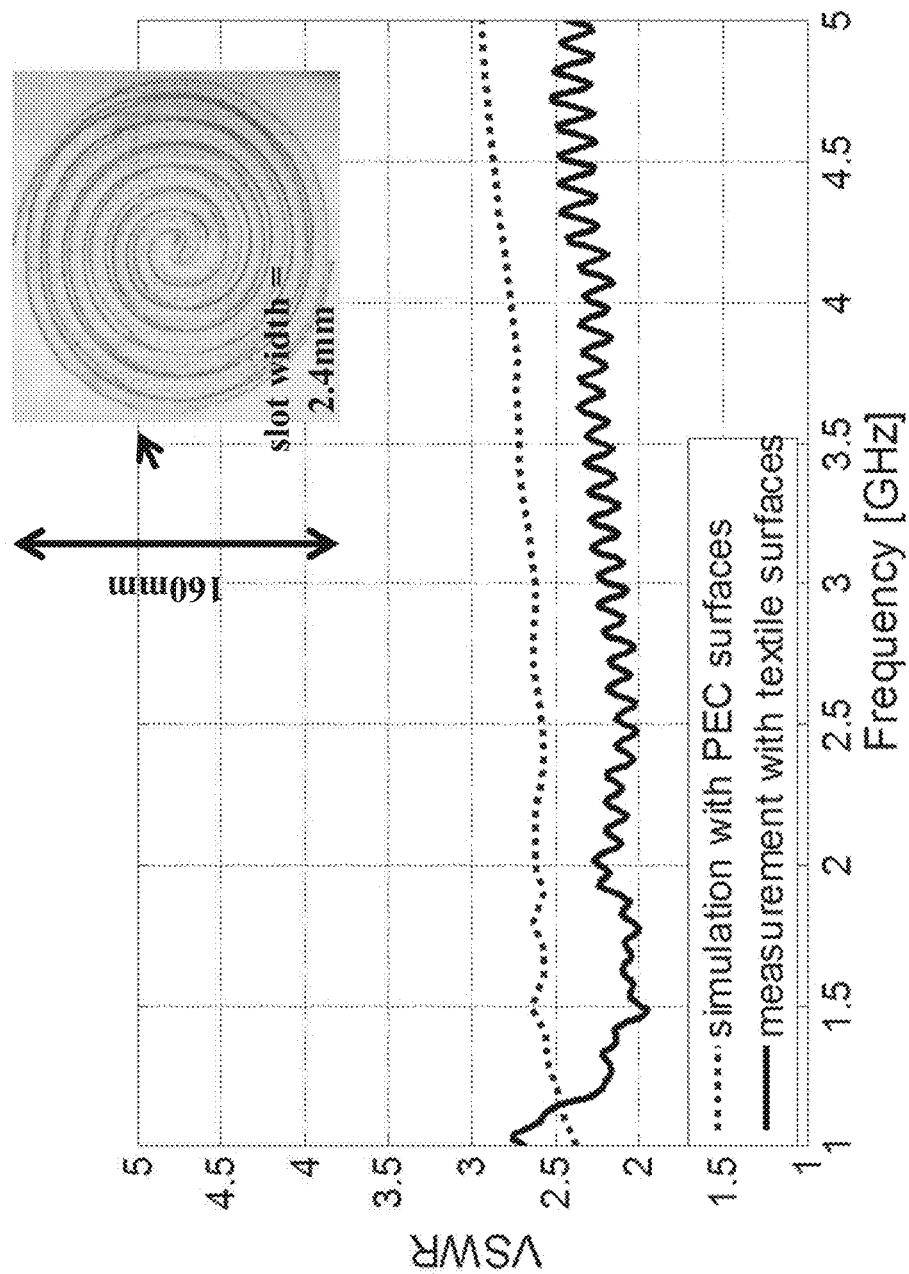
FIG. 14 is a top view of a spiral antenna embroidered using 7-filament Elektrisola E-fibers, embedded within a graphical comparison of the antenna's measured and simulated Voltage Standing Wave Ratio (VSWR) values.

A 1-5 GHz spiral antenna was embroidered on to a polyester substrate, as described above. The conductive thread was 7-filament Elektrisola and was stitched in a single layer. The antenna was a 160 mm diameter Archimedean spiral, with a slot width of about 2.4 mm, and a strip of about 8.5 mm, as shown in FIG. 14. The measured and simulated voltage standing wave ratio (VSWR) was measured and is also shown in FIG. 14. As seen the measurement results are very close to the simulations, which assume perfect electric conductor surfaces. The lower VSWR values can likely be attributed to loss in the textile surface of the fabricated antenna.

Once created, the flexible and stretchable textile electronic device may be used for a variety of applications. For example, textile electronic devices may be used for wireless communications to replace the RF front-end of a mobile phone or to wirelessly transmit position, motion, identity, or healthcare status. Textile electronics may be used in the automotive industry and incorporated into an RFID or sensor to be used in the tire or other flexible components. The electronic devices may also be used for emergency applications, in military applications, for tracking, healthcare (such as for implantable devices), in sporting, for space exploration, and in unmanned aerial vehicles.

Figure 15:
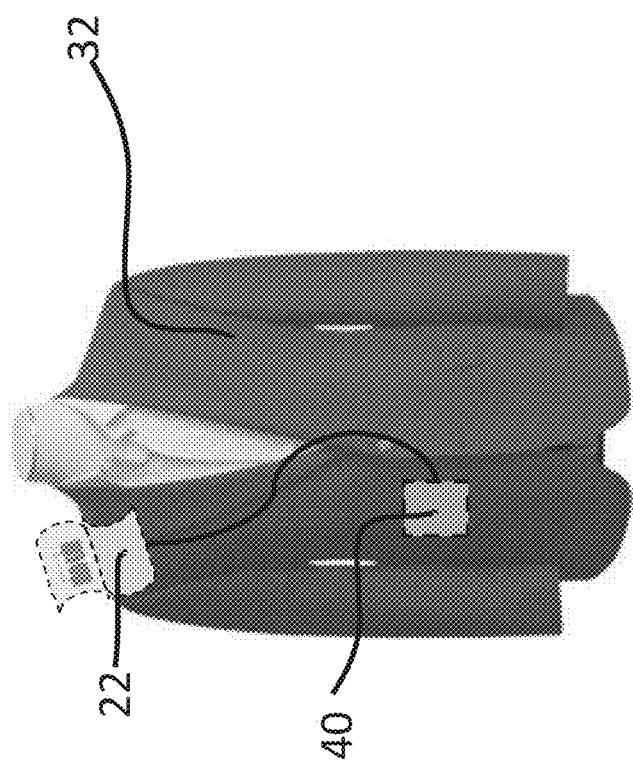
FIG. 15 is a front view of one embodiment of a garment equipped with a stretchable and flexible antenna and associated circuitry.

In one example, the textile electronic device may be an antenna 22 that is incorporated into a garment 32, such as a jacket, as shown in FIG. 15. The antenna may be embroidered directly on the clothing, adhered to the clothing, applied by a loop and hook mechanism, such as a Velcro® attachment, attached with snap buttons, etc.

Figure 16:
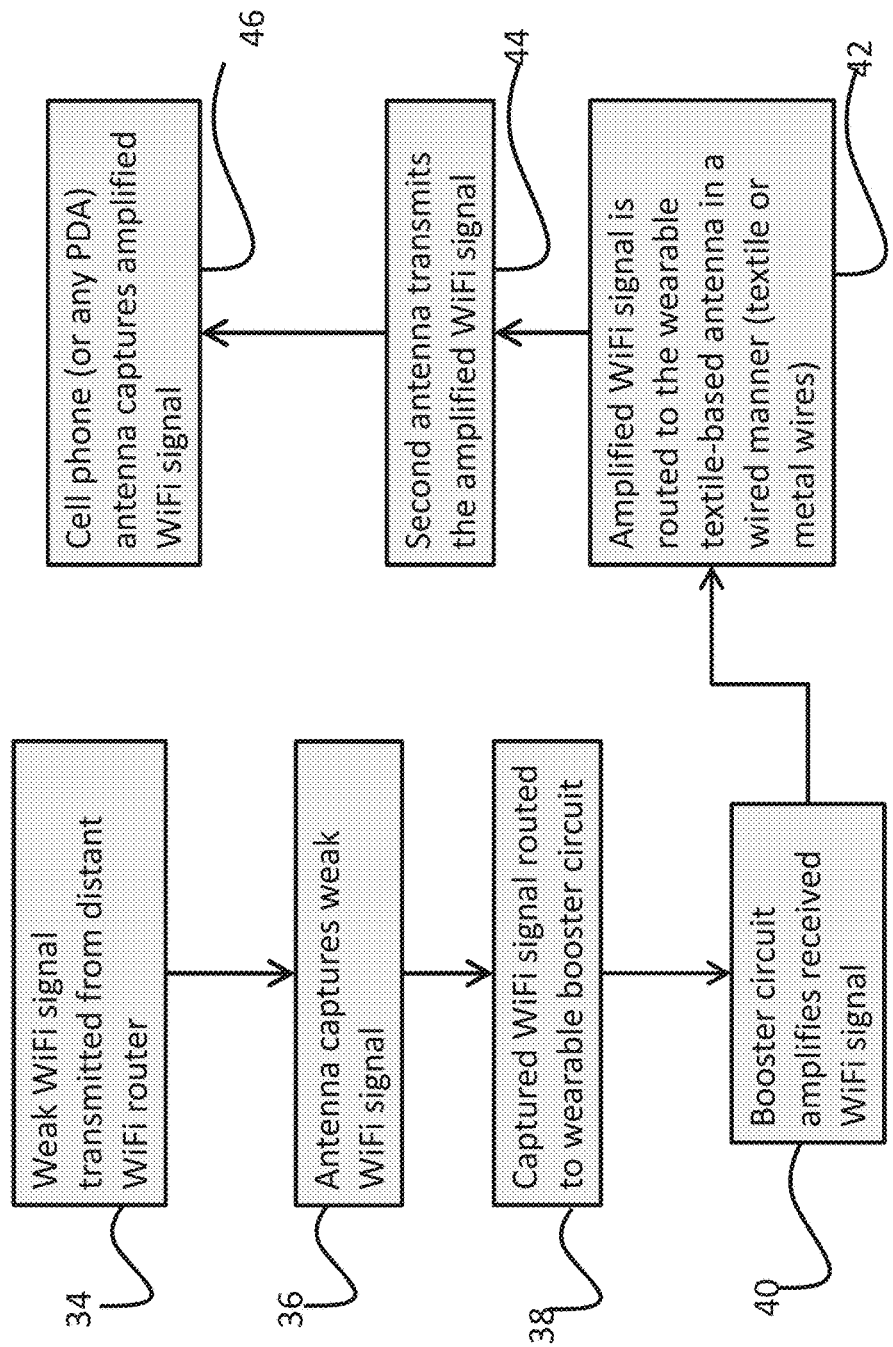
FIG. 16 is a flow chart illustrating one embodiment of a method of using a flexible and stretchable wearable antenna.

In this embodiment, and as shown in FIG. 16, if the wearer, such as military personnel or outdoor enthusiast, is in a location that is experiencing a weak Wi-Fi or cell phone signal from a distant router 34 or cell phone tower, a first wearable antenna disposed on the wearer's garment 32 captures the weak signal 36 and routes it 38 via metal or textile wires to a wearable booster circuit 40 also disposed in the garment 32. The booster circuit 40 may be powered by a portable battery and may include an amplifier, memory, WiFi chip, 4G/LTE chip, filters, USB and Ethernet ports. The booster 40 may be either an extender or a repeater. It should be understood that other types of circuits may be embedded into the garment, depending on the need of the user.

Once the booster circuit 40 receives the signal, the booster circuit amplifies the signal 42 and then routes it via metal or textile wires to the first wearable antenna or a second wearable antenna disposed within the garment 44, which then transmits the amplified signal 46 wirelessly to a hand held radio, a cell phone or other mobile device 48. As used herein, the phrase "mobile device" can mean a portable device having one or more processors, memory and communication hardware. The communication hardware can be configured to communicate wirelessly via a wide area network, a local area network, personal area network, a global positioning system, a cellular network, and combinations thereof. Suitable cellular networks include, but are not limited to, technologies such as LTE, WiMAX, UMTS, CDMA, and GSM. In some embodiments, the mobile device can implement a mobile operating system as machine readable instructions stored on the memory and executed by the one or more processors. Specific examples of mobile operating systems include, but are not limited to, Android, iOS, Blackberry OS, Windows Phone, Symbian, and the like.

In use, it was found that a textile antenna embedded in a user's garment, as described above, may significantly increase the cellular or WiFi data reception. For example, it was observed that the signal reception of a Nokia 6600 was best when placed at a user's head, registering 7 bars (−70 dBm). However, when placed in a user's side pocket, front pocket, or back pocket, the signal decreased to 6 (−75 to −70 dBm), 4 (−85 to −80 dBm), and 1 (−100 to −95 dBm) bars, respectively. However, when the user wore a jacket that included a textile antenna 22 embedded on the shoulder, the mobile phone registered 7 bars of signal strength, no matter the phone's location relative to the user's body. This is because textiles enable wearable antenna with large apertures that exhibit much higher gain than the miniature antennas integrated inside the phone.

Figure 17:
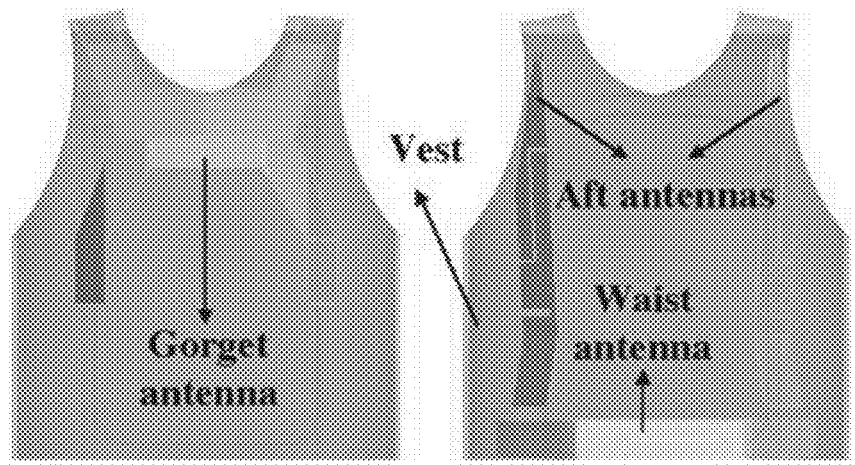
FIG. 17 is a front view of one embodiment of a vest equipped with several stretchable and flexible antennas.
Figure 18:
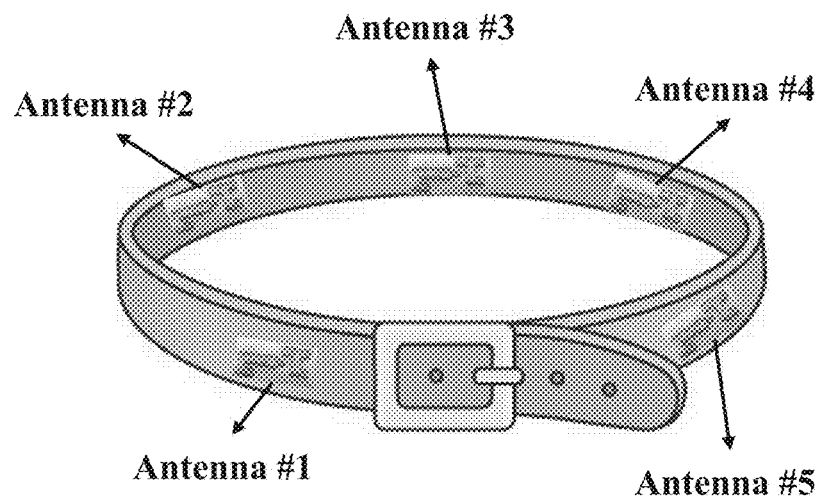
FIG. 18 is a front view of one embodiment of a belt equipped with several stretchable and flexible antennas.

While the antenna is shown on the shoulder of a jacket, it is contemplated that other configurations may be advantageous, such as the use of the antenna in a vest (FIG. 17) or a belt (FIG. 18) configuration. It is also contemplated that more than one antenna may be used on a single garment, increasing the versions of the same wireless signal being captured. Collectively, such a configuration can provide a robust system and potentially reduce the power requirements of the mobile device.

In another embodiment, the textile device incorporated in to the garment may be used for power harvesting, to track the user, to monitor health statistics of the wearer (e.g. respiration, humidity, motion, blood glucose, ECG, temperature, EMG, sweat, SpO2, blood pressure), as a body imaging sensor. It is contemplated that the wearable textile electronic device would be comfortable for the user, would not be obtrusive, and would be durable and robust in order to withstand daily activities and tasks. In desirable, the data collected from the wearer may be transmitted wirelessly to a third party for analysis and/or observation.

In another embodiment, the textile electronic may be used to replace metal based sensors as a body-worn textile imaging sensors. In this embodiment, a surgery-free on-body monitoring device may be used to evaluate the dielectric properties of internal body organs (lungs, heart, liver) and effectively determine irregularities in real-time. This could alert patients and doctors to serious medical concerns several days or weeks before the concern presents with outward symptoms.

To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See Bryan A. Garner, A Dictionary of Modern Legal Usage 624 (2d. Ed. 1995). Also, to the extent that the terms "in" or "into" are used in the specification or the claims, it is intended to additionally mean "on" or "onto." To the extent that the term "substantially" is used in the specification or the claims, it is intended to take into consideration the degree of precision available or prudent in manufacturing. To the extent that the term "selectively" is used in the specification or the claims, it is intended to refer to a condition of a component wherein a user of the apparatus may activate or deactivate the feature or function of the component as is necessary or desired in use of the apparatus. To the extent that the term "operatively connected" is used in the specification or the claims, it is intended to mean that the identified components are connected in a way to perform a designated function. As used in the specification and the claims, the singular forms "a," "an," and "the" include the plural. Finally, where the term "about" is used in conjunction with a number, it is intended to include ±10% of the number. In other words, "about 10" may mean from 9 to 11.

As stated above, while the present application has been illustrated by the description of embodiments thereof, and while the embodiments have been described in considerable detail, it is not the intention of the applicants to restrict or in any way limit the scope of the appended claims to such detail. Additional advantages and modifications will readily appear to those skilled in the art, having the benefit of the present application. Therefore, the application, in its broader aspects, is not limited to the specific details, illustrative examples shown, or any apparatus referred to. Departures may be made from such details, examples, and apparatuses without departing from the spirit or scope of the general inventive concept.

The invention claimed is:

1. A method of making a stretchable and flexible antenna comprising:
    sewing a design onto a fabric substrate with a conductive thread to create the flexible antenna on the fabric substrate;
    adhering the fabric substrate with the antenna onto a surface of an adhesive;
    removing the fabric substrate while the antenna is adhered to the adhesive;
    coating the antenna with a polymer while the antenna is adhered to the adhesive; and
    removing the polymer coated antenna from the adhesive.

2. The method of claim 1, further comprising:
    generating a computer aided design (CAD) of the antenna;
    digitizing the CAD of the antenna; and
    sewing the design onto the fabric substrate based on the digitized CAD of the antenna to create the antenna on the fabric substrate.

3. The method of claim 1, wherein the conductive thread comprises from about 7 to about 664 individual conductive filaments to form a thread, wherein the thread comprises a diameter of about 0.10 (mm) to about 0.5 mm.

4. The method of claim 1, wherein a melting point of the fabric substrate is lower than a melting point of the conductive thread.

5. The method of claim 1, wherein the polymer is stretchable and comprises polydimethylsiloxane and a ceramic material.

6. The method of claim 1, wherein the conductive thread is made from filaments comprising a core and a conductive lining layer.

7. The method of claim 6, wherein the core comprises one of a copper and a polymer, and wherein the conductive lining layer comprises a conductive metal substance.

8. The method of claim 1, wherein the antenna is one of a multi-band and a broadband antenna.

9. The method of claim 1, wherein the antenna is configured to have an operating frequency band from about 700 Megahertz to about 5.9 Gigahertz.

10. The method of claim 1, wherein the polymer comprises a polyurethane polymer.

11. The method of claim 1, wherein the adhesive comprises one of a copper tape and a green tape.

12. The method of claim 1, wherein the coating comprises pouring a polydimethylsiloxane (PDMS) mixture onto the antenna while the antenna is adhered to the adhesive.

13. The method of claim 12, wherein the pouring comprises forming a layer of the PDMS mixture of about 1 (mm) to about 2 mm around the antenna while the layer is adhered to the adhesive.

14. The method of claim 13, further comprising curing the poured PDMS mixture, wherein the removing comprises removing the PDMS coated antenna from the adhesive in response to curing.

15. The method of claim 1, wherein the polymer coated antenna is configured to retain an antenna shape while being bent or stretched.

16. The method of claim 1, wherein the polymer is stretchable and comprises polydimethylsiloxane and rare earth titanate.

* * * * *

UNITED STATES PATENT AND TRADEMARK OFFICE
CERTIFICATE OF CORRECTION

PATENT NO. : 10,263,320 B2
APPLICATION NO. : 15/211005
DATED : April 16, 2019
INVENTOR(S) : Asimina Kourti, John L. Volakis and Robert Lee Page 1 of 1

It is certified that error appears in the above-identified patent and that said Letters Patent is hereby corrected as shown below:

On the Title Page

Item (72), first inventor change "Asimina Kourti" to - Asimina Kiourti -.

Signed and Sealed this
First Day of September, 2020

Andrei Iancu
*Director of the United States Patent and Trademark Office*